United States Patent
Anderson et al.

(10) Patent No.: US 11,551,881 B2
(45) Date of Patent: Jan. 10, 2023

(54) FLEXIBLE SWITCHES AFFECTED BY LATERAL OR VERTICAL ACTUATION

(71) Applicant: AUCKLAND UNISERVICES LIMITED, Auckland (NZ)

(72) Inventors: Iain Alexander Anderson, Auckland (NZ); Markus Henke, Auckland (NZ)

(73) Assignee: AUCKLAND UNISERVICES LIMITED, Auckland (NZ)

(*) Notice: Subject to any disclaimer, the term of this patent is extended or adjusted under 35 U.S.C. 154(b) by 0 days.

(21) Appl. No.: 17/025,761

(22) Filed: Sep. 18, 2020

(65) Prior Publication Data

US 2021/0027955 A1  Jan. 28, 2021

Related U.S. Application Data

(63) Continuation-in-part of application No. PCT/NZ2019/050028, filed on Mar. 20, 2019.

(30) Foreign Application Priority Data

Mar. 20, 2018 (NZ) .......................... 740907

(51) Int. Cl.
*H01H 13/79* (2006.01)
*H01H 13/80* (2006.01)
*H01H 1/14* (2006.01)
*H03K 17/96* (2006.01)

(52) U.S. Cl.
CPC .............. *H01H 1/14* (2013.01); *H01H 13/79* (2013.01); *H01H 13/80* (2013.01); *H03K 17/9625* (2013.01)

(58) Field of Classification Search
CPC .......... H01H 1/14–13/79; H01H 13/80; H03K 17/9625
See application file for complete search history.

(56) References Cited

U.S. PATENT DOCUMENTS 2,007,012 A * 7/1935 Troendly .............. B26B 27/002
30/116
3,681,723 A 8/1972 Goll
(Continued)

FOREIGN PATENT DOCUMENTS

AU 2005203133 B2 8/2005
CN 206210665 U 5/2017
(Continued)

OTHER PUBLICATIONS

PCT International Search Report and Written Opinion, PCT Application No. PCT/NZ2019/050028, dated Jun. 17, 2019, 14 pages.
(Continued)

*Primary Examiner* — Vanessa Girardi
(74) *Attorney, Agent, or Firm* — Fenwick & West LLP

(57) ABSTRACT

A flexible switch has a deformable body and a plurality of electrodes, at least one of the electrodes being provided on the deformable body. The switch has a first state in which the electrodes are spaced apart and a second state in which the electrodes are in electrical contact, and the switch is configured to allow movement between the states when a force is applied to or removed from the deformable body.

14 Claims, 14 Drawing Sheets

(56) References Cited

U.S. PATENT DOCUMENTS

| | | | | |
|---|---|---|---|---|
| 4,852,443 | A | * | 8/1989 | Duncan ................ G10H 1/0551 |
| | | | | 84/733 |
| 5,209,126 | A | | 5/1993 | Grahn |
| 5,597,183 | A | * | 1/1997 | Johnson ................ B42D 3/123 |
| | | | | 281/38 |
| 7,161,460 | B2 | * | 1/2007 | Federspiel ........... H01H 13/702 |
| | | | | 200/310 |
| 9,697,959 | B2 | * | 7/2017 | Anderson ............ H03K 17/965 |
| 2004/0154911 | A1 | | 8/2004 | Burgess et al. |
| 2007/0127164 | A1 | | 6/2007 | Ofek et al. |
| 2013/0100575 | A1 | | 4/2013 | O'Brien et al. |
| 2015/0287552 | A1 | | 10/2015 | Anderson et al. |
| 2016/0214505 | A1 | | 7/2016 | Nakazaki et al. |

FOREIGN PATENT DOCUMENTS

| | | | |
|---|---|---|---|
| GB | 2461712 A | | 1/2010 |
| WO | WO 2019/182459 A1 | | 9/2019 |

OTHER PUBLICATIONS

European Patent Office, Extended European Search Report, European Patent Application No. 19772539.3, dated Feb. 15, 2022, 13 pages.

Korean Intellectual Property Office, Office Action, Korean Patent Application No. 10-2020-7030071, dated Mar. 4, 2022, 15 pages.

* cited by examiner

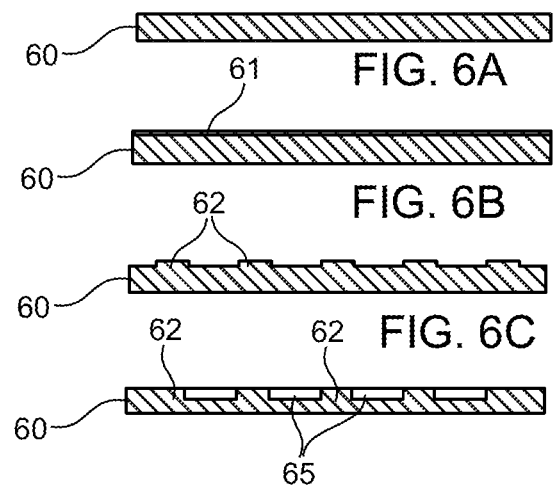
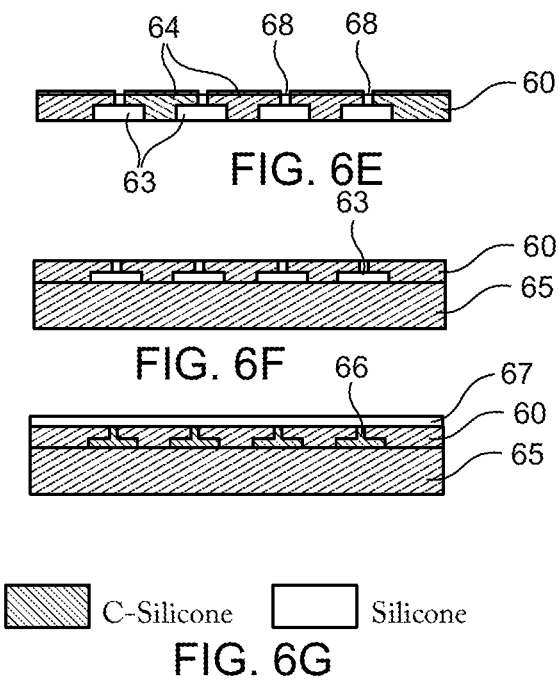
FIG. 6A – FIG. 6G
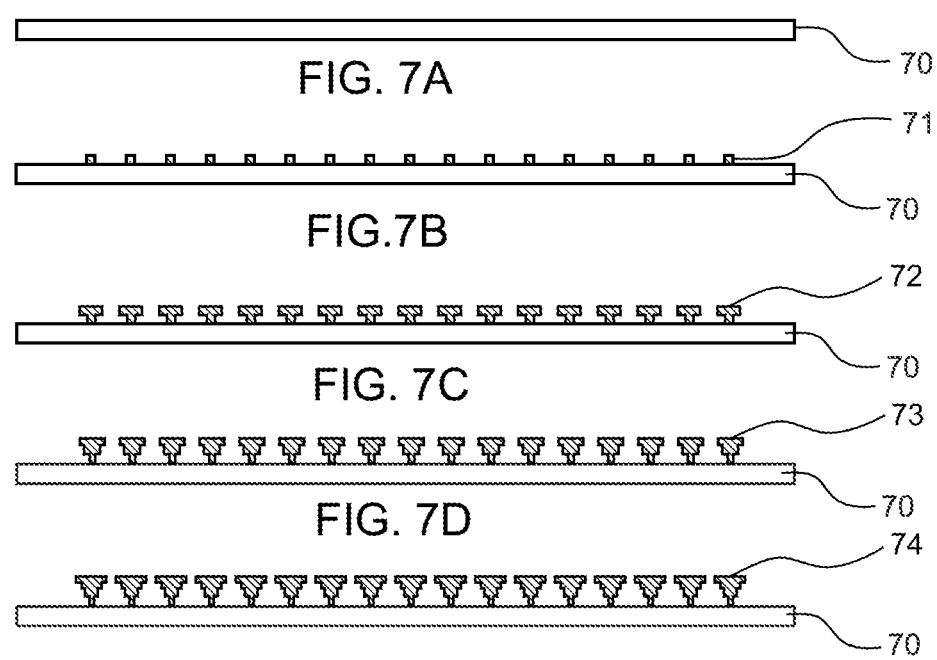
FIG. 7A – FIG. 7E

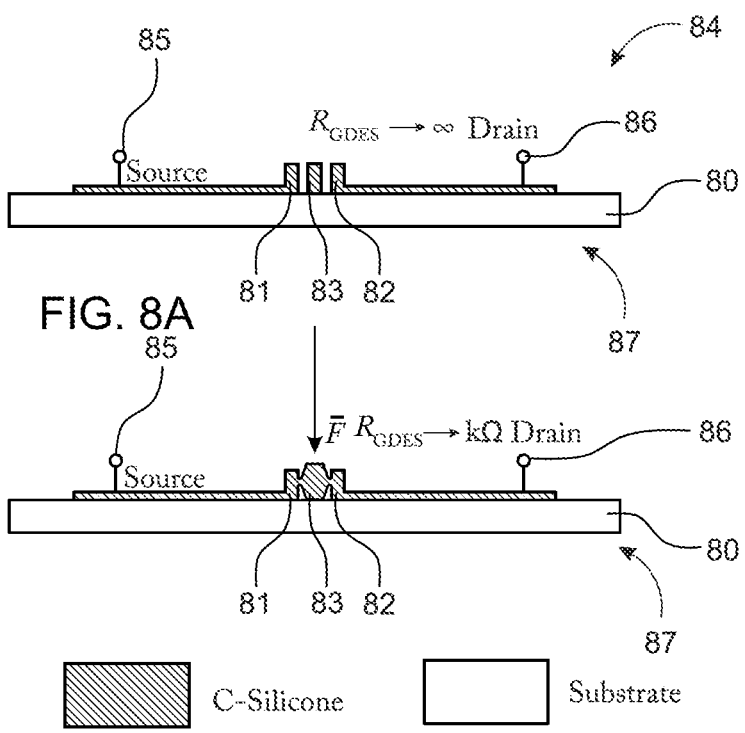
FIG. 8A
FIG. 8B
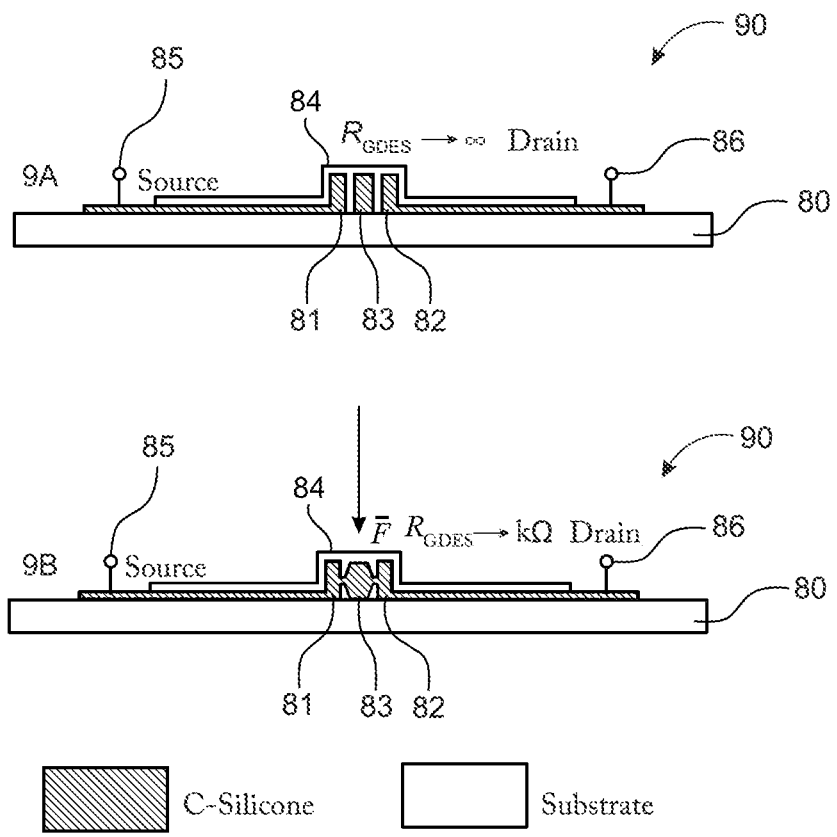
FIG. 9

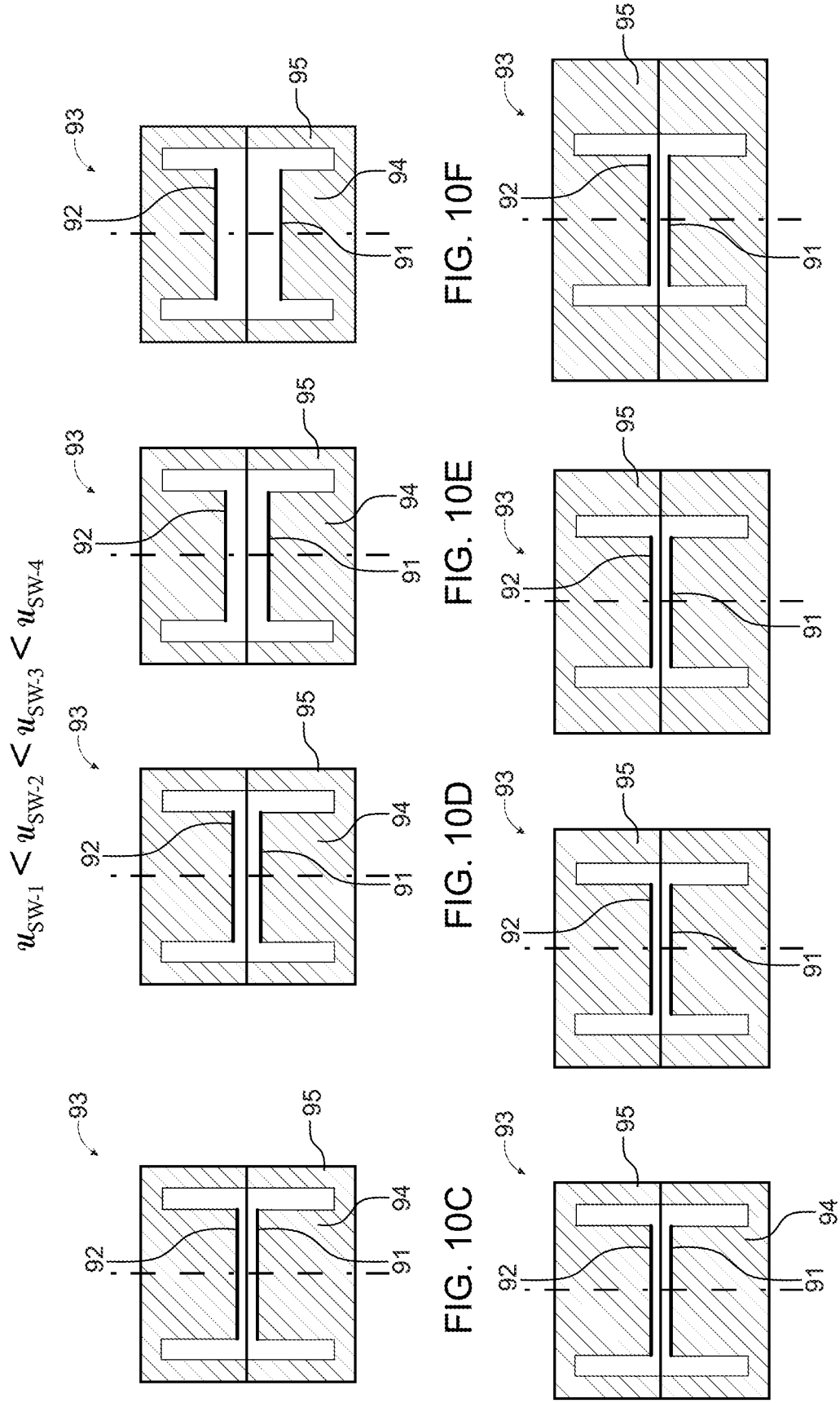

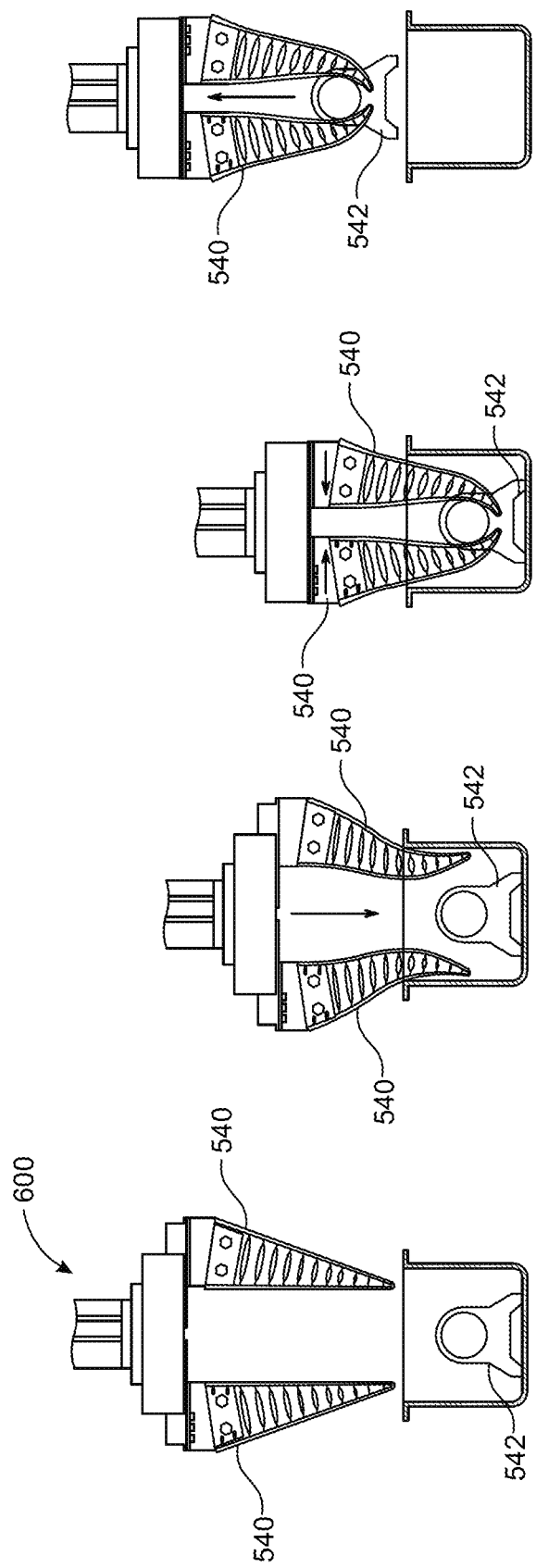

FLEXIBLE SWITCHES AFFECTED BY LATERAL OR VERTICAL ACTUATION

CROSS-REFERENCE TO RELATED APPLICATIONS

This application is a by-pass continuation-in-part application of International PCT application No. PCT/NZ2019/050028 filed on Mar. 20, 2019, which claims priority to New Zealand patent application No. 740907 filed on Mar. 20, 2018, which are incorporated by reference herein in their entirety.

FIELD OF THE INVENTION

The present invention relates to a flexible switch or sensor or circuit apparatus. The apparatus comprises flexible material or materials configured to form circuit elements including devices such as switches and sensors, and circuits that include these elements. In particular embodiments the apparatus comprises a soft conductive material mounted on, or in connection with, a flexible membrane.

BACKGROUND

Switches are present in many modern devices, operating to indicate or effect a change, or indicate an extent or degree of change. For example, limit switches and proximity switches are typically operated by the motion of a machine or by the presence or absence of an object. Limit switches need to be rugged, easy to install and reliable. Various types of limit switches are available, the most common being mechanically or magnetically operated. These switches can be placed on every day appliances, such as photocopiers, printers and refrigerators, or in more complex machinery. However, limit switches can be complex and expensive and on-going use can cause failure due to moving parts or changes in orientation.

U.S. Pat. No. 3,681,723 describes a membrane switch. The membrane switch uses two opposed sheets of material which are support so that there is a predetermined space between them. A user applying a force between these sheets, at least one of which is flexible, allows a mechanical contact on one of the sheets to bridge conductive elements on the second sheet. Membrane switches are commonly used for keyboards or other interfaces. In some instances, at least one of the sheets may be made flexible, however a careful arrangement of the opposed sheets is required to ensure that switching occurs accurately.

US20130100575 shows a dielectric elastomer which has been modified to provide a switching capability. The dielectric elastomer device (DED) comprises a flexible dielectric elastomer sandwiched or mounted between flexible electrodes. The DED is coupled or coupleable to a flexible conducting track. Movement of the DED causes movement in the flexible track and where the flexible track is appropriately designed this can result in switching over the percolation threshold (the threshold between where a material containing an array of particles is conducting or non-conducting). This can create a change in resistance of order of magnitude. However, the system requires careful construction of the conducting track.

The electric circuit device of US20130100575 may therefore be used as a dielectric elastomer switch (DES), enabling analogue and/or digital or Boolean circuitry to be integrated into the dielectric elastomer device. Doing so provides "soft" electronics for controlling an actuator or generator without any external circuitry, eliminating off-membrane circuitry and permitting simple fabrication (the DED and conducting element or sensor being made of the same materials, in the same process). A DES is useful for switching high voltage signals and can be printed onto dielectric elastomer surfaces using the same technology for making the DEDs themselves.

US20150287552 shows a development from US20130100575 in which, in an embodiment, a similar dielectric elastomer and conductive track design is used. However, the conductive track is now designed such that the effective geometry of the conductive track changes suddenly upon deformation. This means, for instance, that the effective cross sectional area of the conductive track changes with movement of the switch. This enhances the switching by increasing the change in resistance and increasing the sensitivity of the switching. However, in each case there remains some parasitic conductivity when the switch is in an 'off' state.

The soft switches of the prior art generally suffer from one or more disadvantages which may include unpredictable or inconsistent behaviour, linearity in the resistance/deformation relationship, complexity of design or fabrication, the need for hand fabrication, and/or difficulties in automating fabrication.

SUMMARY OF INVENTION

Accordingly in one aspect the invention may broadly be said to consist in a flexible switch comprising: a deformable body; and a plurality of electrodes, at least one of the electrodes being provided on the deformable body; the switch having a first state in which the electrodes are spaced apart and a second state in which the electrodes are in electrical contact; and wherein the switch is configured to allow movement between the states when a force is applied to or removed from the deformable body.

The deformably body can be reversibly deformable, to allow the switch to cycle between states, so that the switch may be used repeatedly. The electrodes provide electrically conductive contact regions, so that they function as switch contacts. Thus, in the second state, an electrically conductive path is formed i.e. the switch is in a closed state. In the first state, the switch is open.

The switch takes advantage of the different responses to pressure/force of the deformable body so that the electrodes may be selectively disposed in the open or closed state. This means that the switch can be designed so that a force is applied to the deformable body the electrodes move together to create a conductive path. This provides a clearly detectable, or sharp, change between an 'ON' state (e.g. in contact) and an 'OFF' state (e.g. separated).

In at least some embodiments or examples the switch is flexible. The switch may be fully flexible. There may be no rigid elements that comprise the switch.

In some embodiments or examples the deformable body is elastically deformable. The body may be resilient, or be reversibly deformable. In one example the body comprises a dielectric elastomer.

In an embodiment or example the reversibly deformable body is pre-strained (pre-stressed).

In an embodiment or example one or more electrode support elements are provided to carry or support one or more electrodes. The support elements may comprise part of the deformable body, or be adjunct to the deformable body. The support elements extend from the deformable body, or the remainder of the deformable body.

In an embodiment or example the electrode support elements comprise a first end coupled to the reversibly deformable body and a distal end remote from the reversibly deformable body, wherein distal end is wider than first end. In an embodiment the distal ends of the electrodes are in contact in the second state.

In an embodiment or example the profile of the elements is anyone of or more of: T-shaped; inverted triangular shaped; and/or tapered.

In an embodiment or example the plurality of elements comprise an array of compliant conductive elements.

In an embodiment or example the elements are elongate and arranged in parallel. The elements may be arranged as a first array of elements and a second array of elements, the elements of each array being interdigitated.

In an embodiment or example the switch is configured to move between the first and second states at or beyond a known, or substantially known force.

In an embodiment or example the plurality of elements have a plurality of further states, the first, second and further states providing discrete switching levels.

In an embodiment or example the plurality of elements have a plurality of further states, each of the further states comprising contact between further of the plurality of elements; and wherein increasing the force applied to the reversibly deformable body causes movement between the further states.

In an embodiment or example the switch is configured to move between the further plurality of states at or beyond a known or substantially known force for each state.

In an embodiment or example the reversibly deformable body is configured to change shape in response to the force to allow movement between the states.

In an embodiment or example the configuration comprises geometry or material parameters of the reversibly deformable body.

In an embodiment or example the elements are contained within the body, or within a cavity of the body.

In an embodiment or example the body is a ring or toroidal shape. In an embodiment the ring or toroidal is flattened out to form a rectangle.

In an embodiment or example the elements are attached or coupled to internal surfaces of the body, wherein the force brings the internal surfaces into contact and/or proximity.

According to a second aspect, the invention may broadly be said to consist in a switch; the switch comprising: a deformable body; and a plurality of elements, each element comprising a conductive portion, the plurality of elements extending from the deformable body and at least one of the elements having a greater cross section above the surface of the deformable body; and wherein the plurality of elements are configured to come into electrical contact when a force is applied to or removed from the deformable body.

Anyone or more of the above embodiments or examples may also be applied to the above aspects where suitable.

According to a third aspect, the invention may broadly be said to consist in a switch; the switch comprising: a plurality of deformable elements, each element comprising a conductive portion, at least one of the elements configured to change in cross section when a force is applied to or removed from the at least one element; and wherein when a force is applied to or removed from the compliant body the plurality of elements are configured to move between a first state wherein the plurality of elements are in electrical contact and a second state wherein the plurality of elements are spaced apart In an embodiment or example the elements are configured to increase in cross section by expanding when compressed. In an embodiment the elements are configured to decrease in cross section by retracting when tensioned.

In an embodiment or example all of the plurality of elements is configured to change in cross section when a force is applied.

In an embodiment or example a covering means covers or encapsulates the plurality of elements.

In an embodiment or example the plurality of elements are positioned between substantially rigid elements.

Anyone or more of the above embodiments or examples may also be applied to the above aspects where suitable.

In another aspect the invention provides a flexible electrical circuit comprising a switch according to any one of the preceding statements.

According to another aspect, the invention may broadly be said to consist in a method for manufacture of a flexible switch comprising the step of printing flexible components on a flexible substrate.

According to another aspect, the invention may broadly be said to consist in a method for manufacture of a flexible switch comprising flexible elements attached to a flexible substrate the method comprising the steps of: forming the elements in a mould; and attaching the substrate to the formed elements.

Anyone or more of the above embodiments or examples may also be applied to the above aspects where suitable.

The disclosed subject matter also provides a switch apparatus which may broadly be said to consist in the parts, elements and features referred to or indicated in this specification, individually or collectively, in any or all combinations of two or more of those parts, elements or features. Where specific integers are mentioned in this specification which have known equivalents in the art to which the invention relates, such known equivalents are deemed to be incorporated in the specification.

Further aspects of the invention, which should be considered in all its novel aspects, will become apparent from the following description.

DRAWING DESCRIPTION

A number of embodiments of the invention will now be described byway of example with reference to the drawings in which:

FIGS. 4A-4E show a multi-level switch having a plurality of states between OFF to ALL ON.

FIGS. 6A-6G show the steps of another manufacturing method for a different switch.

FIGS. 7A-7E show the steps of a further alternative manufacturing method.

FIGS. 8A and 8B show an alternative switch in OFF and ON states.

FIG. 9 shows an alternative switch in (a) OFF and (b) ON states.

FIGS. 10A-10J show alternative switch configurations.

FIGS. 18A-18D show an example of use of the gripping apparatus of FIG. 17.

DETAILED DESCRIPTION OF THE DRAWINGS

Figure 1:
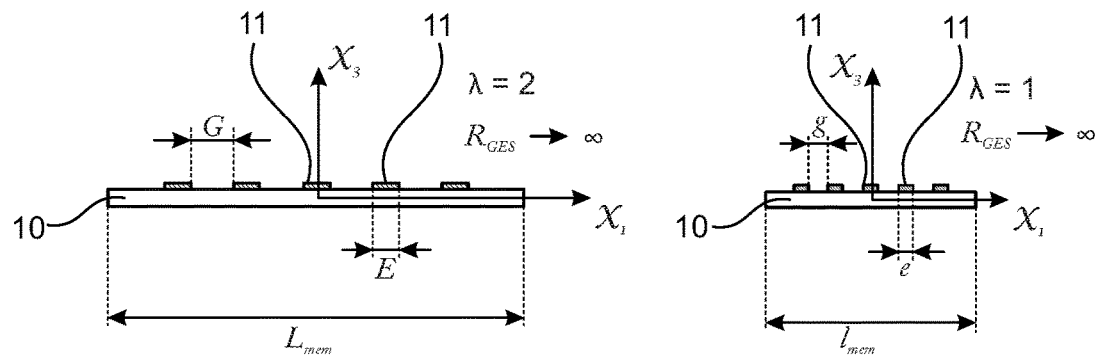
FIG. 1 shows a prior art device which cannot function as a switch.

Throughout the description like reference numerals will be used to refer to like features in different embodiments.

Embodiments relate to providing a circuit element such as a switch apparatus and/or a method which will allow the fabrication of a fully flexible switch or circuit and/or allow more sensitive switching.

Embodiments also relate to providing a switch apparatus and/or switching method which will at least go some way to overcoming disadvantages of existing systems, or which will at least provide a useful alternative to existing systems.

FIG. 1 shows a prior art system similar to that of patent publication US2013100575. In this system a substrate 10 supports a series of conductive elements 11 which are attached to the surface. The substrate or membrane 10 is flexible or compliant. That is to say it is able to, or configured to, change shape on application of a force without breaking or fracturing. The force may be mechanical or may be induced by an electric, electromagnetic or other force. In the system of FIG. 1 movement of the membrane 10 along axis $x_1$ will move the conductive elements 11 closer to one another. Since the conductive elements 11 are connected to the flexible substrate along their entire length, a deformation of the substrate will always deform the conductive elements in the same amount. Because of that behaviour such a design can never act as a switch, because it is not possible to bring the conductive elements into contact.

Figure 2:
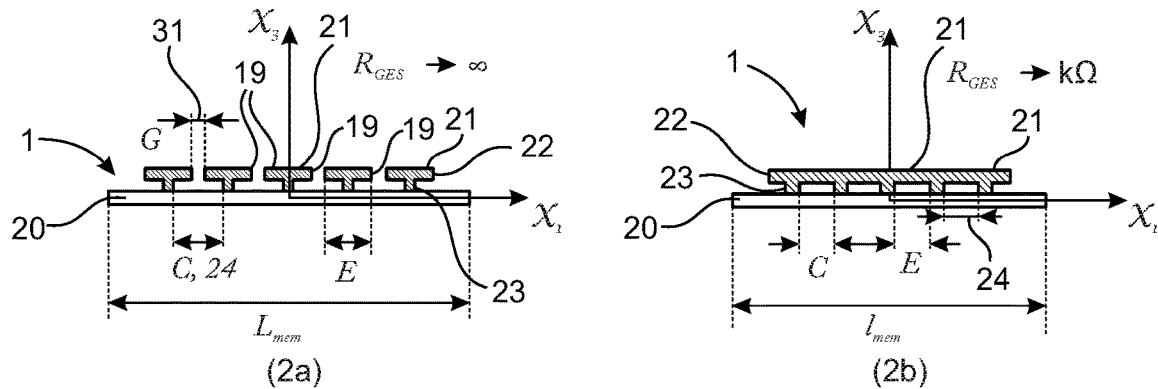
FIG. 2 shows a switch in (a) OFF and (b) ON states.

FIG. 2 shows an embodiment of the present system in which a flexible switch is provided. The switch includes a deformable body comprising a substrate or membrane 20 which is provided with a plurality of adjacent or side-by-side support elements 21 which form a series of elements extending along an axis of the body or substrate as shown by axis X1, and which support, carry or comprise electrodes that function as switch contacts. Elements 21 may comprise a part of the body 20, or may be attached or coupled thereto. The elements 21 may extend from the body or membrane 20 and/or may have a three dimensional shape such that in profile or cross-section there is a wider portion distal from (or above as shown in FIG. 2) the surface of the substrate 20. In the embodiment of FIG. 2 the cross section is 'T' shaped. The 'T' comprises a first proximal portion or protrusion 23 extending from the substrate 20 and a second distal portion or crossbar 22 extending horizontally or away from the first portion at a distal end. However a skilled person would understand that a plurality of possible shapes provide the ability to have a part that extends so that a distal end of that part carrying or comprising the electrode are spaced from the body so they can be contacted by an adjacent or neighbouring part. In one example the shape of the part comprises a cross-section above the surface of the substrate 10, including where the cross bar 22 is part way up the protrusion 23, or an inverted triangle or otherwise. In some embodiments only a portion of the elements is conductive, for instance only crossbars 22.

The substrate or membrane 20 is deformable, that is to say it is compliant or flexible. Preferably the substrate or membrane is reversibly deformable so as to allow a plurality of stretching or compression actions to be performed. The substrate may be a dielectric layer and may have a number of conductive paths or conductive fillers in its body or on the surface to conduct electricity, which may comprise a signal(s) to the elements 21. The substrate may also be referred to as a carrier. In a particular embodiment the switch is formed from a single, preferably low resistance, silicone (or other flexible) composite containing conductive fillers. In some embodiments the switch may comprise, or be combined with, components of the devices of patent publications US20130100575 and US20150287552 included herein in full by reference. For instance, a substantially similar dielectric elastomer may be used as the substrate. Furthermore, the switch may include components of the switching devices or conduction paths described in the documents, to provide connections to the switches contained herein or to modify them. The inherently flexible or compliant nature of the switches disclosed herein, together with the components referred to in the publications above, mean that fully flexible electric circuits may be constructed. This is described in more detail below. The invention allows flexible circuits to be provided for use in a wide variety of applications including for example sensors to detect movement for measurement or location purposes in manufacturing processes, robotics, pressure sensors, or even for use in wearable items such as shoes, gloves and garments.

Elements 21, or parts of those elements are doped or loaded with conductive material, so that the elements either comprise, or support, electrodes. In one example, the outer edge surfaces 19 of the distal part of each element proved electrically conductive electrodes that comprise the switch contacts. In this example, central regions of the elements 21 and the substrate 20 have conductive paths therein which connect to the electrodes on the outer edge surfaces 19. In another example, the entire distal end 19 is electrically conductive and thus has surfaces that provide the switch contacts. In yet another example, the entire elements i.e. parts 22 and 23 are electrically conductive.

FIG. 2 shows the advantage of combining a compliant membrane 20 with three-dimensional elements 21. In FIG. 2A the membrane is in a first state (which may be the stretched or relaxed state). The elements 21 are not in contact so the resistance between them is very high. If the substrate 20 is compressed the elements move towards one another into a second state (the relaxed or compressed states). However the cross bars 22 are wider than the protrusions 23. As the width of the cross bars is independent of the substrate, the cross bars 22 (or wider portions) can bridge or extend to the neighbouring element 22. This results in electrical contact between the electrodes provided on neighbouring or adjacent elements 21. Once the electrodes make physical contact with each other there is a substantially lower resistance between the conductive paths in the switch. Therefore the two states comprise a high resistance state (approaching infinite resistance) and a low resistance state (which is adjustable, but can be kOhms or less) and thus provide a switching capability. This is in contrast to the prior art, as shown in FIG. 1, where the elements can never come into contact which limits any reduction in resistance.

To describe the switch in another way, the electrically conductive electrodes on elements 21 are provided on wider element portion 22. The resultant T-shaped structures form cavities of width C, 24 in the initial condition or state where a gap 31 of width G exists. In this 'open' state, substantial electrical current cannot conduct in direction $x_1$, representing an off state. In the open state, the GDES resistance tends to infinity, in the absence of direct conductive paths. When the switch is compressed, or allowed to contract, the elements 20 contact, this causes the resistance of the GDES to drop.

The switching points and the general behaviour (normally-open [NO] or normally-closed [NC]) of the switch 1 are tuned by the geometry of the elements 21 (e.g. conductive parts and the electrodes) and the elements' association with a flexible carrier membrane 20, substrate or other structure (collectively the "Carrier") and pre-strain of the Carrier in some embodiments. The switch 1 may have further advantages as it can operate at lower voltages than prior art switches. This is because switching is augmented by opening and closing of physical gaps between conductive structures. The elements 21 may be formed of conductive mixtures which enable resistance of several kOhm in the closed state, with reductions to several Ohm (and lower if needed), by introducing metallic or other fillers (e.g. silver) to the composite mixture used to form the electrodes and/or conductive paths, as will be apparent to those skilled in the art.

In embodiments of the switch 1, the accuracy of the required state change is provided by careful geometric design of the switches. Any one or more of the physical or geometric properties of the switch 3 can be adjusted to target a particular level or type of deformation or necessary switching strain (or levels of force of the system in FIG. 4). For instance any one or more of the following may be varied: the flexibility of the substrate 20 may be variable; the pre-strain applied to the substrate; the distances between elements 21, 40; the height and/or length of the elements 21, 40; the resistance of the elements 21, 40 or conductive paths on the substrate 20; the length of element cross bars; and/or the arrangement of the elements 21, 40 on the substrate.

These factors may be optimised by trial and error or, once a known material has been selected the expected results may be calculated by equations known to those skilled in the art.

The substrate 20 is preferably pre-strained when the elements are attached or coupled thereto. This is because the pre-straining or stressing of the substrate allows and/or improves to movement of the substrate between a relaxed or unmoved state and a stretched or compressed state. For instance, the substrate 20 of FIG. 2 may be strained when the elements 21 are applied to it. This means that when the force is removed from the substrate 20 the elements will move closer together. Alternatively, the relaxed or nominal state of the substrate may have the elements separated and a compressive force applies to the substrate may move the elements 21 closer. In some embodiments of the switch the membrane requires sufficient pre-strain to fully close the gap or gaps G 31 when the membrane relaxes to length $l_{mem}$ with cavities at closed length c 24. In many instances pre-strain is desirable. For example, To get a switch that opens when it is strained, a certain, small amount of pre-strain is helpful before the application of the switch contacts, or before application of the structures that support the switch contacts, such as elements 21. This will ensure a reliable closed state after production. It can be difficult to ensure a proper electrical contact of the switch contacts without prestrain in the substrate.

Figure 3:
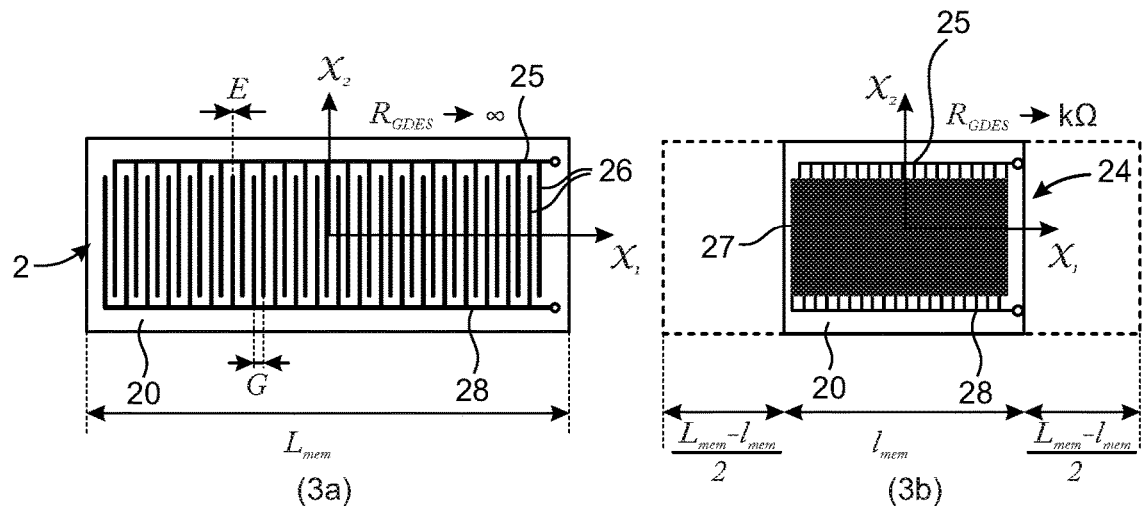
FIG. 3 shows a digitated switch (a) OFF and (b) ON states.

FIG. 3 shows another embodiment of the switch 2 wherein a plurality of elements 21 are used to create a single switch. This embodiment uses contact between a plurality of elements 21 to, for instance, enhance consistency and/or reduce resistance of the switch when the switch is in the closed state.

FIG. 3a shows the 'off' state where the membrane 20 has elements arranged in an array of parallel fingers 26 extending from arms 25 and 28. The fingers of each array are interdigitated with each other. The fingers 26 and 28 preferably have the 'T' shaped profile of FIG. 1 (although only the top of the 'T' is visible in FIG. 3). The electrodes in this embodiment are provided on at least the edge surfaces between the distal ends of the fingers 26 as described above in relation to the FIG. 2 embodiment. In this state the switch contacts are spaced apart and are not in electrical nor physical contact with each other. Thus, the resistance between arms 25 and 28 tends to infinity. In this example the ratio between gap size G (between fingers 26) and finger width E is 1. However, other geometries will allow performance to be altered. When the substrate 20 is compressed (i.e. pre-strain is released or compression applied) by a suitable amount, contact can be made between the switch contacts on fingers 26 connected to each of the arms 25 and 28. In this case compression by 50% will allow contact between the electrodes (due to the E, G ratio) 50%. FIG. 3b shows the 'on' state in which a strong electrical connection is formed between the electrodes, and thus between the conductors provided on or in arms 25 and 28.

The switch of FIG. 3 may be used as a point-of-care sensor for 50% compressive strain. By adjustment of the gap over which electrodes move to contact each other, and the span or width of the electrode (for example the top of the "t"), the required switching point between open and closed states can be tailored to specific requirements, for example sensing a strain threshold. For instance, the switch could be applied to a structure or wall to measure movement levels. In normal usage, the switch could be in the open state and no signal would be received by a control device (such as a microprocessor or computer). However, should a large vibration or movement take place (for instance in an earthquake) the compression may reach a threshold at which the switch 2 turns on and the control device or control means registers a compression. This compression may signify that the building has moved beyond the required amount and must be inspected or repaired. The switch may be modified to control the amount of compression or stretch required. For instance, the compressive strain to switch a device is governed by the ratio of the electrode width E and electrode gap width G. The smaller the gap, compared to the electrode width, the less compressive strain is required to switch states. In particular embodiments the substrate may have an adhesive or other attachment means to allow it to be fastened to surface or object to sense.

The arms 26 (or elements 21) may be formed from a compliant electrode material, such as doped silicone to provide conductive, flexible paths. The area of connection 27 and/or the interdigitated electrode arrangement offers a reliable and fault tolerant (via redundant switching paths) arrangement, as will be apparent to those skilled in the art. It is also clear that the number of fingers 26 is not limited, as at least two fingers 26 would allow operation, as would tens or hundreds of printed fingers. It will also be clear that many switch contact or electrode arrangements, shapes and forms may be designed for specific requirements.

FIG. 4 depicts a further embodiment of the switch 3 in which multiple compression (or tension) levels or states can be sensed or switched. This may be referred to as a multi-point-of-care sensor. The switch 3 has a plurality of switch components with a change in geometry (and therefore operation point or state) between the components. In this embodiment each switch contact support element 40, 41, 42, 43, 44 has a constant width, however the gap width G decreases from the left to the right. It is noted that the particular order is not always pertinent to the operation of the switch (e.g. if each of the elements are connected to an arm similar to FIG. 3).

Figure 4A:
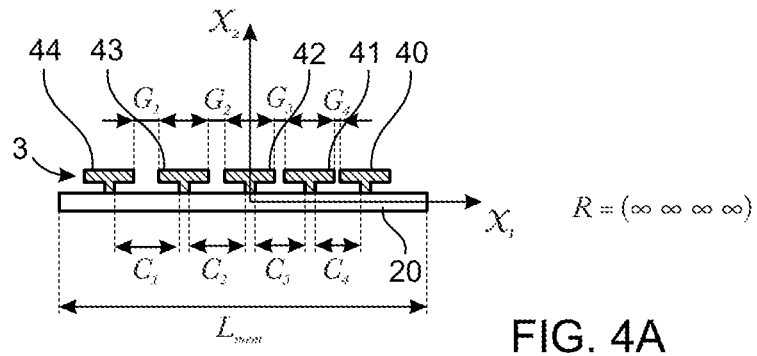
Figure 4B:
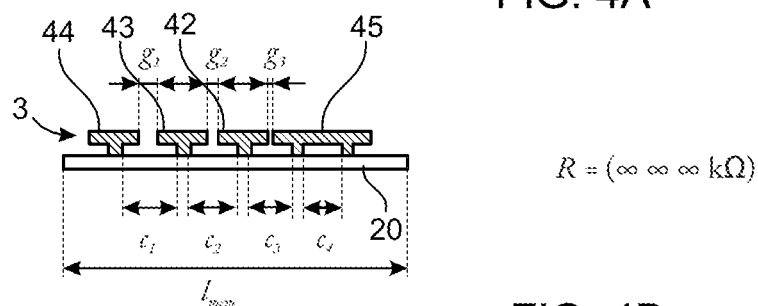
Figure 4C:
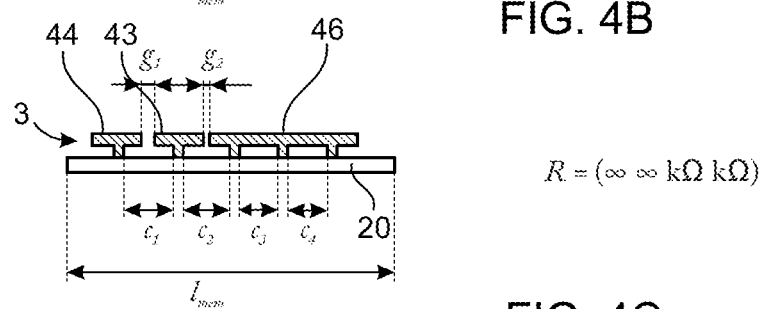
Figure 4D:
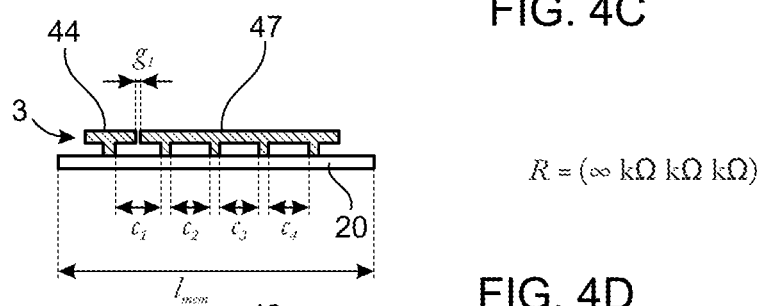
Figure 4E:
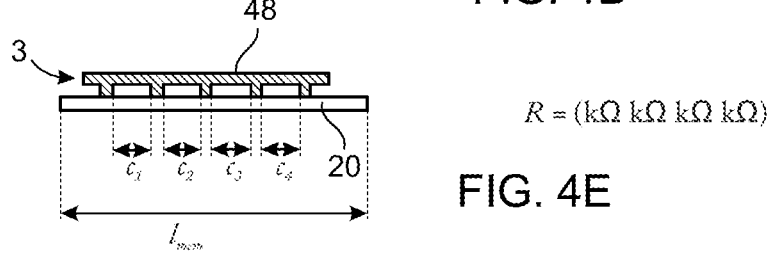
Figure 5A:
FIGS. 5A-5H show steps of a manufacturing method for a switch.
Figure 5B:
Figure 5C:
Figure 5D:
Figure 5E:
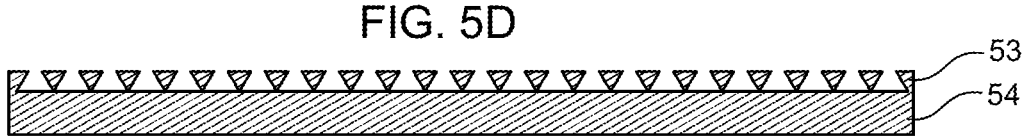
Figure 5F:
Figure 5G:
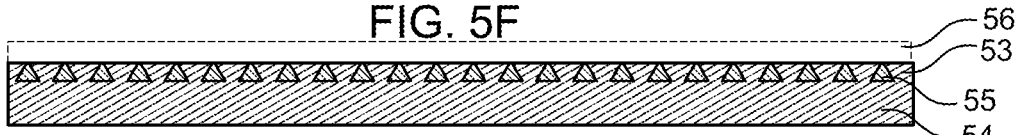
Figure 5H:
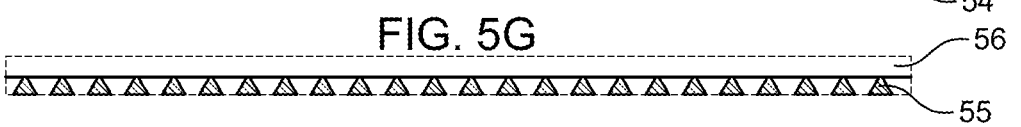

Consider the operation of the switch 3 where the first electrode 40 is connected to a power source (e.g. a low voltage) and each of the other electrodes connected to an LED (any electrically controlled indicator could be used). If the substrate 20 is compressed from the relaxed state (FIG. 4*a*) the second state will be reached (FIG. 4*b*). In FIG. 4*b* only the first two electrodes 40, 41 are in contact to form a first switch component 45. This would activate the LED connected to element 41. Because of the increase distance between electrodes the remaining electrodes are in high resistance paths. Compressing the substrate 20 further will move the switch to the third state (FIG. 4*c*). In the third state the first three electrodes 40, 41, 42 form a connected switch component 46. This provides a low voltage path to the LEDS connected to first two elements 41, 42. Further compression allows the connection of electrodes 43 and 44 in turn.

Therefore, the embodiments of FIGS. 3 and 4 provide a switch or sensor that has multiple switching points. Furthermore, the switching points are controllable or tunable, in that they can be controlled by their geometry to switch at particular levels of compression or extension. Further adjustments to the switches are possible. For instance, the switching elements could be provided across a surface so that the location of the compression could be identified. This can be linear or non-linear. Instead of using the interdigitated fingers of FIG. 3, a series or array of mushroom shaped elements 20 are present on the surface with alternating elements 20 connected to power sources and LEDs respectively.

The switch embodiments disclosed here can provide a large change between conductiveandnon-conductivestateswithrelativelysmallalterationsofstrain. The embodiments disclosed here can extend the switching ability by a novel electrode, or electrode support, structure. The novel electrode structure offers an extended ratio of resistance between the on and off switch states, with resistance in the off state tending to infinity. This characteristic of high off state resistance is desirable in some industrial circumstances (e.g., galvanic switching).

The elements 21 which have a shape extending from the surface can also provide other advantages. For instance, high conductivity can be provided without requiring metallic conductors. While use of metallic conductors is widely known in related art, such conductors are vulnerable to fracture on repeated flexure, and cannot support substantial extension without failure leading to unpredictable electrical characteristics and associated poor performance. As described above, the elements 21 are flexible, and may be partly or entirely conductive so as to couple electricity to the surface in order to provide electrodes that may contact each other. In some embodiments only a portion of the elements 21 that provide or support the electrodes are conductive. For instance, only the crossbars of the elements 21 in may be conductive. The substrate 20 contains conductive paths that are electrically connected to the electrodes. These will typically be insulated by the substrate material itself.

The switches herein described can be used in combination with previously described flexible or compliant switches. These combinations of percolation switches (switches which change the concentration of metal particles in a material from above to below percolation or vice-versa, such as described in US20150287552) can create dielectric switches with industrially useful behaviours. For example, a buffered switch can be created where the switch comprises a switch as described herein and one or more of the elements 21 or substrate 20 is below percolation (e.g. is made of a material possessing a conductive filler load under the percolation load). When the device is compress the elements 21 will initially contact this will increase the conduction of the device. However full conduction will not occur until the compression of the switch causes the percolation threshold to be crossed. At this point the conduction between elements 21 and the conduction of the electrodes, or conductive paths on the substrate 20 are both conducting leading to a low resistance state. A similar switch can be constructed for a stretching arrangement. These arrangements may provide strain and stress measurement capabilities. A general concept is to first bring the elements 21 into contact, and then further stress must be applied to compress a, or the, conductive elements past the percolation threshold. This property can enable a sensor with distinct behaviours separated by a well-defined and pre-set threshold, or defined thresholds Construction The manufacture of the switches can be achieved in a number of ways. These methods are not limited to the creation of the switches herein described and may, for instance, also be adapted to create the switches of the prior art. However there are advantages when the switches can be mass produced or digitated arrays can be produced quickly. For example T-shaped, or inverted triangular and other cross-section, electrodes can be produced using a moulding process. Two possible manufacturing methods are described herein:

1. A mould is formed in silicon using an anisotropic etching process and template rollers are used to structure electrode preforms to an intermediate carrier in a roll-to-roll process:

2. 3D printing can be used.

FIGS. 5A-5H depict an embodiment of method 1 where a mould is used for the production and the production of a membrane with geometric switches. The origin is a substrate 50, such as a thin Si (silicon) wafer, or a wafer with buried SiO2 layer. Either the thickness of the wafer or the depth of the buried SiO2 layer are used to define the height of the conductive electrodes. The substrate 50 is covered with photoresist 51 which is then structured to create a desired shape for the electrodes. In the example FIGS. 5A-5H, photoresist 52 is placed to indicate the gaps between electrodes 55. Via anisotropic etching the cavities for the electrodes are etched, either through the thin wafer, or until the buried SiO2 layer is reached. After removing the photoresist, the resultant structure 53 (i.e. the inverted triangles) is inverted and bonded or attached to a second wafer or substrate 54. This substrate may be a glass substrate or similar intermediate carrier as will be known to those skilled in the art. This results in a series of triangular cavities being formed open at a top or first end. This completes the mould structure To produce the switches from the mould the cavities are filled with the material 55 for the elements 20. This may be a silicone-conductor mixture (C-Silicone) which can then be cured, or kept in its uncured phase until the next step is completed, as require. Finally a membrane 56 preferably pre-strained is plasma bonded, or otherwise attached electrodes 55 in the cavities. In embodiments of the method a pre-strained or unstrained Carrier or substrate can be bonded during the curing process of the silicone mixture in the cavities. The compliant or flexible nature of the substrate or carrier 56 can improve or promote separation of the electrode-membrane assembly from the mould. This may be achieved by a peeling process, with other separation methods also being suitable. Preferable low viscose silicones are used in order to exploit capillary effects for complete filling of the electrode or element 55 cavities.

FIGS. 6A-6G show a similar method used for an alternative shape of electrode. This method can be generalised to various electrode cross-sections by shaping the cavities in the silicon wafer. For instance a T-shape can be produced via two-sided reactive ion etching. This etching method enables nearly straight etching. The method uses a substrate 60 which may be a plain silicon wafer. The substrate 60 is coated with photoresist 61. The photoresist 61 is structured (e.g. through exposure to light) to form guide structures 62 on the surface of the substrate 60. An etching step is performed to create the top-side or cross bar. This etch is preferably a highly anisotropic first reactive ion etching to form flat rectangular type structures 63 A repetition of the photoresist 64 and etching steps forms narrower support structures. This second etching step may be easiest to perform from the other side of the substrate 60. The etched wafer 60 is then bonded to a substrate 65 (e.g. silicon wafer or glass) to form the mould. As describe above this allows material 66 for the elements to be filled into the cavities. The material 66 may be liquid C-silicone. The membrane 67 is then bonded to the filled into the cavities. In the final step the membrane 67 and bonded structures 66 are separated (by movement or chemical removal) from the substrate 65.

FIG. 7 shows a 3D printing to create elements 20 on a substrate layer. The substrate layer 70 is first prepared and then individual elements 71, 72, 73, 74, including conductive portions, are printed or deposited in a stepwise fashion. In an example the electrode is layered to a wider dimension in each stage of a multi-pass printing strategy. Alternatively single or groups of electrodes can be printed in turn. The conductive silicone is fully or partly cured after each printing step and the next layer is applied. This produces an "inverted staircase" structure with cavities, appropriate for contractive deformation of the membrane, with converging movement of the individual electrodes. It will be clear to the skilled person that this technique is not limited to inverted stepped triangular type forms. The method can produce a wide variety of electrodes (including the hollow structures preferable in some circumstances, as will be known to those skilled in the art).

Embodiment of FIGS. 8A and 8B

FIGS. 8A and 8B show a further switch or sensor 84. In this example, the flexible switch comprises flexible portions or elements 81, 82 and 83 which may be mounted on substrate 80. The substrate in this example may be rigid. At least one of the elements 81, 82, 83 are formed or configured so that their diameter or cross-sectional width can change in response to a force being applied or removed. In a particular embodiment the system comprises at least one compliant or reversibly deformable element 83. Compliant element 83 is configured such that a compressive force from above (F) causes expansion horizontally with respect to the plane of the substrate. A skilled person will realise that other deformation may take place to allow the operation, but this is the most straightforward. The horizontal expansion causes compliant element 83 to contact neighbouring element(s) 81 82, as shown in FIG. 8B. Element 83 comprises an electrode, or the outer surface or surfaces of element 83 which contact adjacent elements 81 and 82 are provided with an electrode(s), using processes such as those described earlier in this document. Similarly, elements 81 and 82 comprise electrodes. Or the surface or surfaces of elements 81 and 82 which contact adjacent surfaces of element 83 are provided with electrode(s). Thus deformation of deformable body 83 as shown in FIG. 8B causes contact between the electrodes. This forms a low resistance path from the source to drain, so the switching action form the open of OFF state to the closed or ON state is effected. The neighbouring elements may also be more or less compliant, or may be dimensioned to achieve a change of switch state under required conditions. For instance FIG. 8A shows the compliant element 83 extending above the neighbouring rigid elements so that the force is not felt by the neighbouring elements.

It will be seen that another possible example may comprise two elements, for example element 83 and one of the neighbouring elements 81 or 82, appropriately connected to the source 85 and drain 86 so that deformation of element 83 causes the contact (or release of contact) between the two elements.

In a further example the switch or sensor of FIG. 8A consists of a source electrode terminal 85, a switching electrode 81 82 83 and a drain electrode terminal 86, where the source and drain may be interchanged. A conductive path, for instance formed of C-silicone material leads from the source 85, through the switch to the drain 86. In a particular example the source 85 is connected to a supply voltage and the drain to a sensor or indicator—e.g. a Light Emitting Diode (LED). In the initial state shown in FIG. 8a no conductive path exists as there is a substantial gap between elements 81, 82 and 83. When a force F (of a required level), deforms the compliant element 83, the element expands in direction of the elements 81 82 or electrodes connected to the source 85 and drain 86. This causes contact and closure of the electrical circuit, or at least a much lower electrical resistance. In the present example the LED will signal the occurrence of the monitored event.

The embodiments of the sensors or switches described herein can be configured or adapted to monitor critical force, pressure, or other physical phenomena causing deformation by tuning its geometry and material characteristics, as will be apparent to persons skilled in the art.

In a further embodiment each of the elements 81, 82, 83 may be deformable. An example is switch 90 is shown in FIG. 9. In this embodiment the switching element may be covered or encased in a sealing means or material 84. Silicone is a suitable material for this. This process helps to seal the switch from the environment and may improve the durability or operation. Where the switch is enclosed it may be advantageous to have each element 81, 82, 83 be compliant or flexible because this allows a consistent reaction to the force to be felt across the switch. The operation of this switch 90 is broadly similar to the switch 87 of FIGS. 8A and 8B: when a force F is applied to the switch between the cover and the mounting substrate the elements 81 82 83 expand or become wider in cross-section. This brings the elements 81 82 83 into contact. It will be apparent that a similar switch could be made using only two elements which expand into contact (e.g. no middle element 83). This switch 90 has an advantage that each element can be less compliant, because it only needs to expand half the distance of an element in switch 80 where only a single element 83 is flexible.

The physical properties of the switch may be tailored to produce desired characteristics, including tactile behaviours.

Figure 10A:
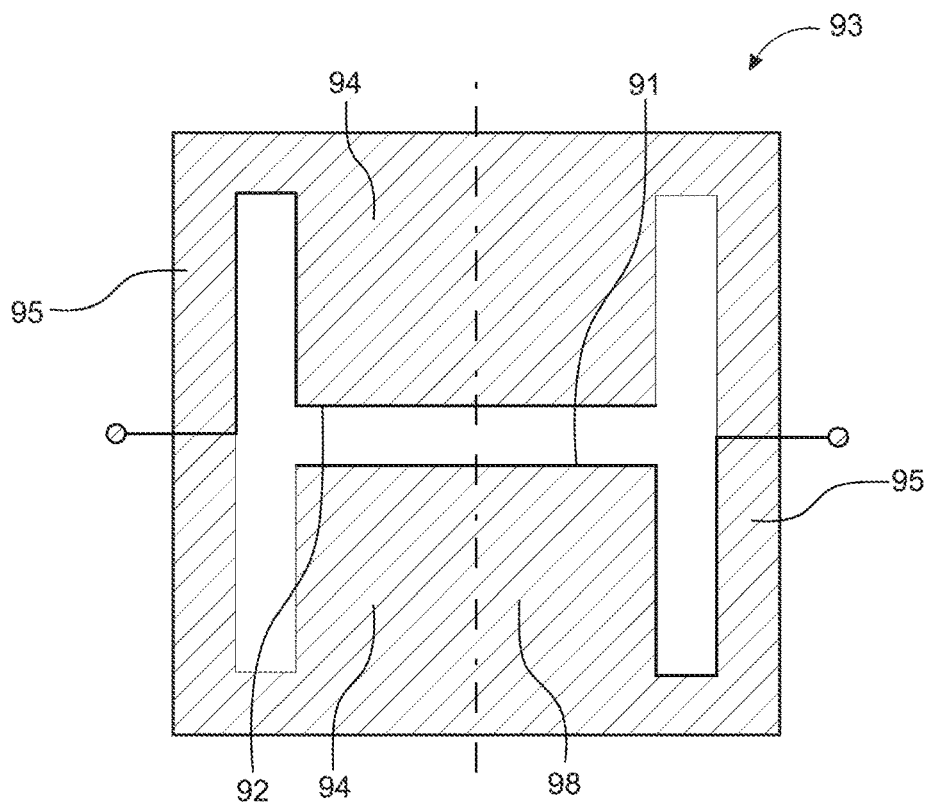
Figure 10B:
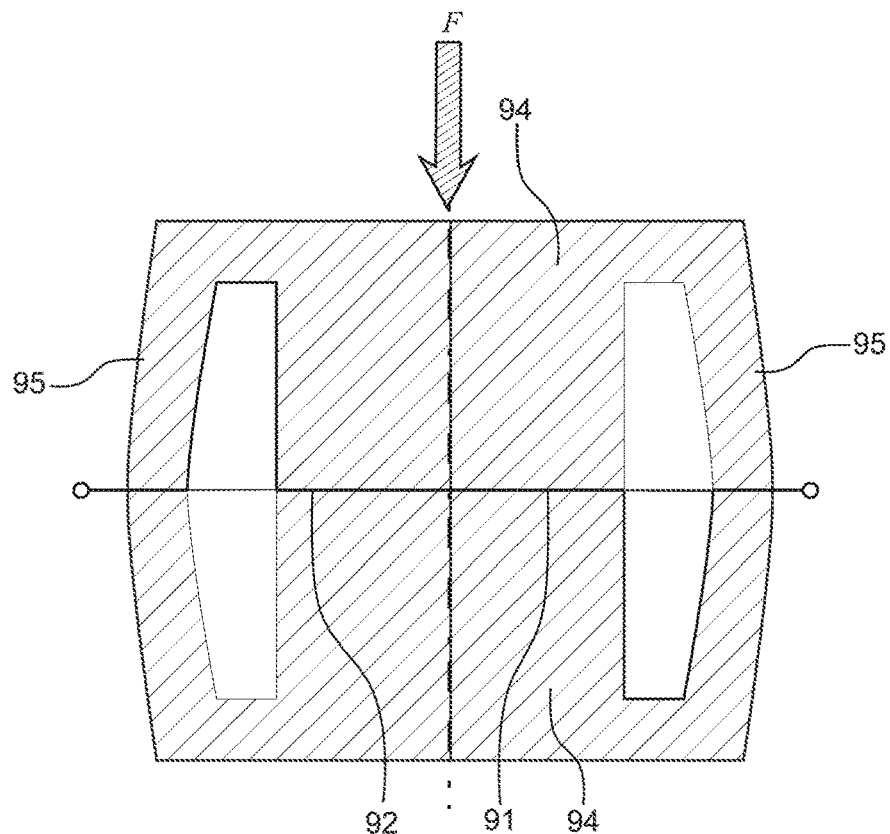

FIG. 10A shows a further switch 93. In this embodiment the relationship between the compliant body or substrate 98 and the electrodes 91 92 provided on support portions or elements 94 has been changed. However the performance remains similar in that there is an open state where the electrodes 91 92 are separated and a closed state where the electrodes 91 92 are in contact. Transition or movement between these states is achieved by a force F being applied to the compliant, or reversibly deformable, body 93, as shown in FIG. 10*b*. When a force is applied between two surfaces of the body 93 (in FIG. 10A the top and bottom surfaces) the body flexes, for instance in areas 95 allowing the elements 94 to move together so that electrodes 91 and 92 can be brought into contact. In preferable embodiments when the force is removed the body 98 returns to the original state, resetting the switch.

FIGS. 10C-10F show switches 93 in which the distance between the electrodes 91 and 92 is progressively increased by varying a dimension (in this example a height dimension) of the support element 94. However, other parameters, such as the dimensions of portions 95 remain the same. Thus, the distance over which the force F must act in order to cause the electrodes 91 and 92 to contact each other is progressively greater, so progressively more work is required to effect a change of state as one progresses from FIG. 10C to FIG. 10F. This illustrates how the design of the deformable body can be used to control a required property of the switch.

Another example is shown in FIGS. 10G-10J. Here, the dimension (the width dimension) of portion 95 is progressively increased. However, other parameters, such as the dimensions of portions 94 remain the same. Thus, the magnitude of the force F required to cause the electrodes 91 and 92 to contact each other is progressively greater, so progressively more force is required to effect a change of state as one progresses from FIG. 10C to FIG. 10F. This illustrates another example of how the design of the deformable body can be used to control a required property of the switch. In this example the portions 95 act as a deformation control portion which is provided as part of, or coupled to, the deformable body.

The switch 93 could have a variety of uses, for instance providing a limit or proximity switch in a door or refrigerator which controls a light or is combined with a microprocessor to indicate the state of the door. A possible advantage is that the substantial portion of the switch, or the entire switch is flexible, reducing the complexity of the switch and the number of parts which may break.

Figure 11:
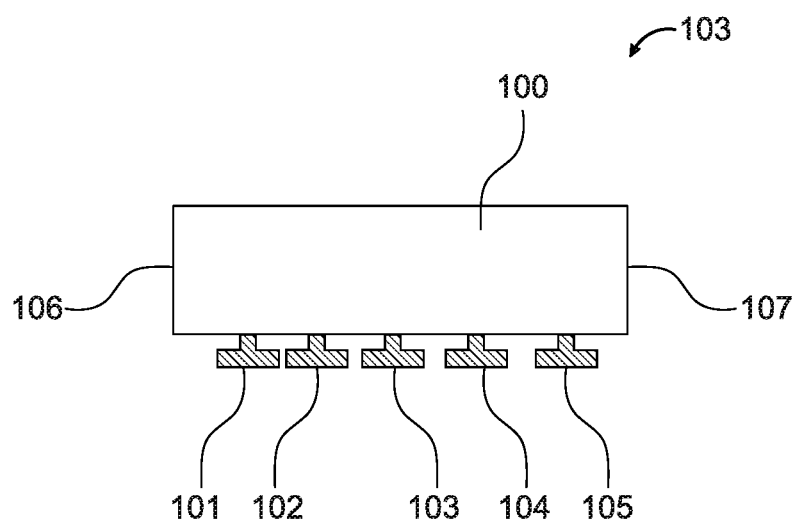
FIG. 11 shows an alternative switch in an off position.

FIG. 11 shows an alternative switch 103 design similar to the switch of FIG. 2 for use in a door or refrigerator type situation. The deformable substrate 100 may be substantially thicker to improve contact between the two surfaces 106 and 107 used for the switch or sensor. One of the surfaces 106 or 107 is provided in contact with the frame of the door for example, and the other is contacted by the door when the door is in the closed position. The switch could of course alternatively be mounted on the door. The elements 101 to 105 can be selectively connected to a source and drain (e.g. power supply and LED) in a manner similar to that described with reference to FIGS. 3 and 4. Each of the one or more switches formed by the elements may be geometrically designed to operate at a particular force, or at a force relative to the other switches. When a force is applied between the top and bottom surfaces of the body or substrate 100 the elements 101, 102 are first brought into contact to provide a conductive path. This then indicates that a pressure is present (such as a door being partially closed). As the door is fully closed further elements are brought into contact with each other, ending in element 105. In alternative embodiments the relaxed state of switch 103 may be compressed and a tension or strain between the surfaces is required to activate the switch.

Figure 12:
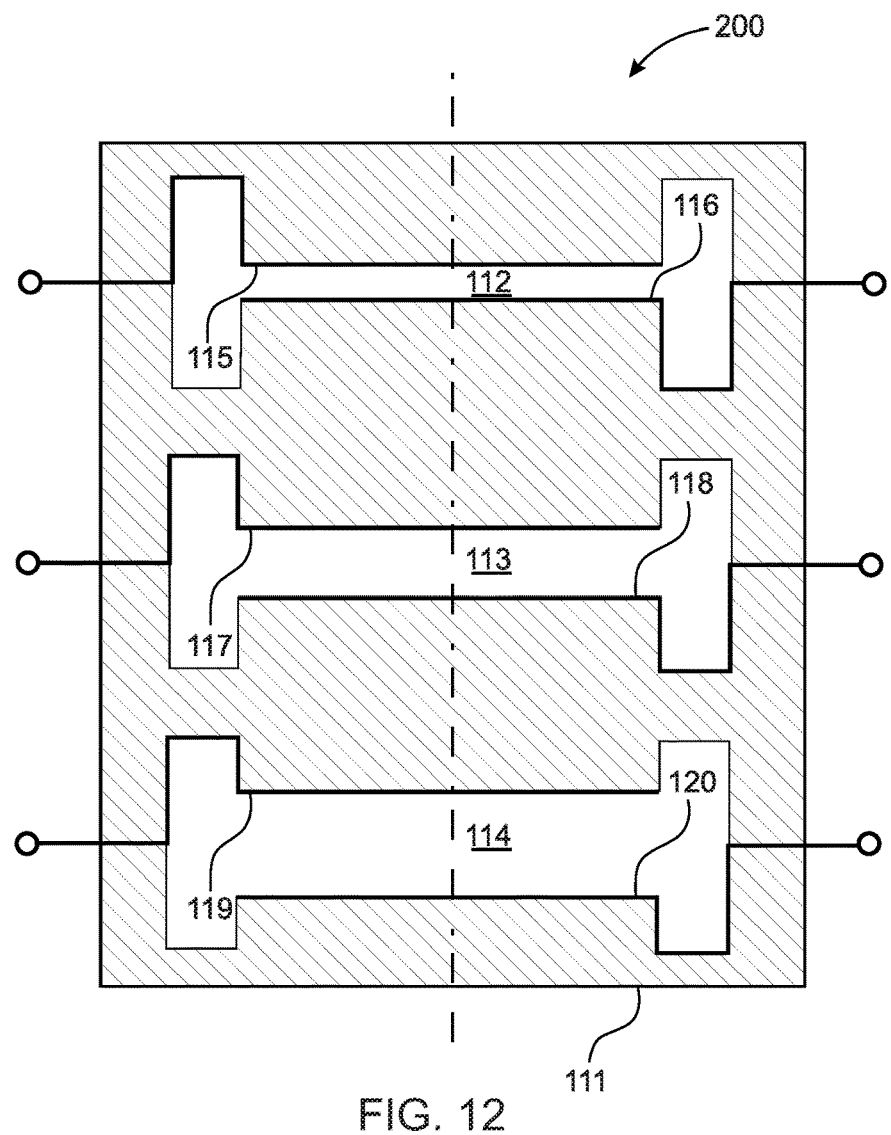
FIG. 12 shows an alternative multi-level switch in an off position, but having a plurality of possible states in use.

FIG. 12 shows a multiple level switch 200 corresponding to the multilevel switches of FIG. 4. The multi-level switch combines a plurality of units similar to FIG. 10 (or other switch embodiments described herein). Each of the one or more switches may be geometrically designed to operate at a particular force, or at a force relative to the other switches. For instance the substrate flexibility or width of the substrate could be adjusted, alternatively or in combination the size of gaps 112 113 114 could be different. In this manner the force required to create a connection between terminals 119 120 may be made larger than that required for terminals 117 118 or terminals 115 116. Therefore, analogously to FIG. 4 the switch provides a controllable switching element capable of simply indicating both the presence and the levels of a force, or be used to measure a change in position of one object relative to another for example.

Figure 13:
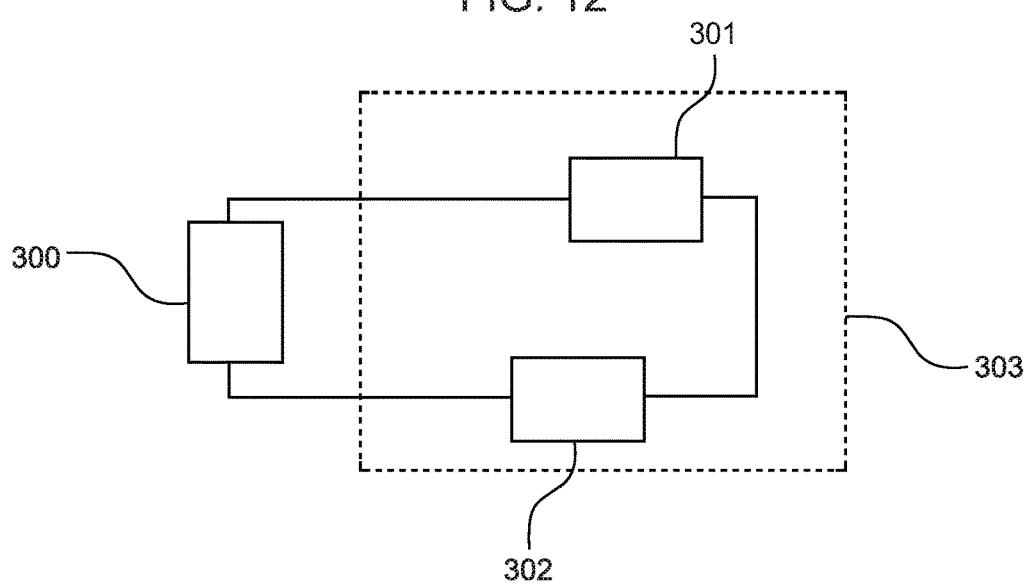
FIG. 13 shows a schematic diagram of a circuit including a switch according to any one of the examples referred to herein.

In embodiments of the switches herein described the switches may be combined with or coupled to a microprocessor or control means to provide a self-contained switch or measurement system. For instance a microprocessor may be suitably coupled to the substrate, or connected to the substrate by wires or other connection means. The microprocessor may be a computer or logic device. Preferably the control means has a resistance sensor or polls the switch to determine the present resistance. When a resistance change is detected the control means may send a communication or an electrical signal or activate a signal such as an LED. In further embodiments the control means may monitor the switch to determine a change in resistance over time, so that a gradually increasing force can be noted, or alternatively ignored. Various other means of monitoring switches and embodiments where these may be useful will be known to a person skilled in the art. In FIG. 13, a schematic is shown in which a power supply 300 is connected to circuit component 302 by switch 301. Switch 301 may be any switch according to the examples provided above. In one example, component 302 may comprise a flexible circuit component such as dielectric elastomer sensor or actuator. Thus, at least that part of the circuit in box 303 may be fully flexible. Moreover, the power supply 300 might also be a fully flexible component, for example a dielectric elastomer generator.

Figure 14:
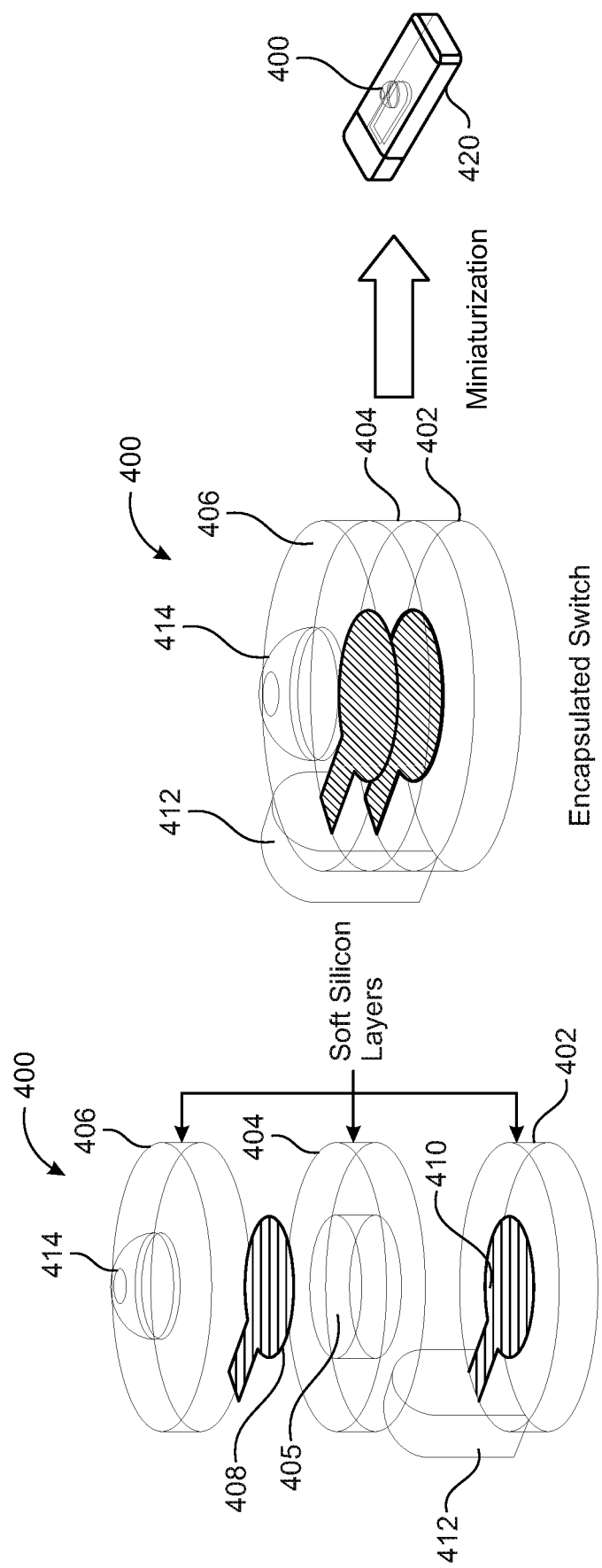
FIG. 14 shows another example of a flexible switch.

FIG. 14 shows another embodiment in which an encapsulated switch 400 is provided comprising first (or lower) flexible layer or substrate 402 which carries a flexible electrode 410, a flexible central layer 404 with an opening, recess or aperture 405, and a second (upper) layer 406 that carries flexible electrode 408. The second layer 406 optionally includes an activator portion 414 which is formed, adapted or configured to deform under a force (in this example a downward force toward the first electrode 410) so as to move the second electrode through opening 405 to make contact with the first electrode and thus close the switch. Alternatively or additionally, the activator 414 may be provided on the first layer, and may also be present on the examples or embodiments discussed below. The activator in this example comprises a thickened portion of the layer, located proximate to the opening 405. The dome shape is but one example. Electronics 412 may be conveniently located adjacent to the flexible switch structure. Moreover, the switch 400 may be housed in a housing 420.

Figure 15:
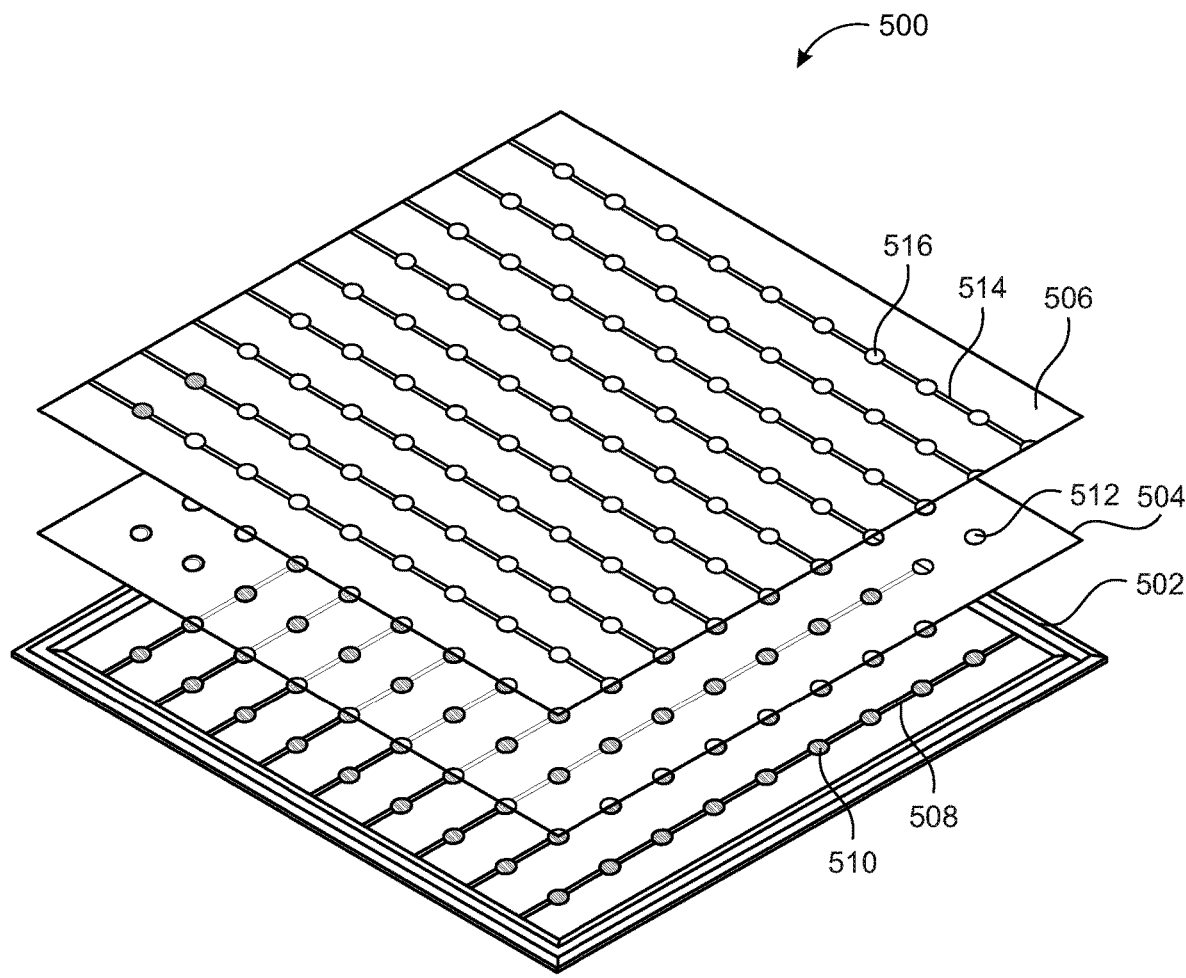
FIG. 15 shows a switch array that may be used as a sensor, including a structure similar to that of FIG. 14.

The structure described in FIG. 14 above incorporated into a linear line of switches which can be used to detect a force along the linear array. Also, a two dimensional switch array 500 can be provided as shown in FIG. 15. Here the layers 502, 504 and 506 correspond to layers 402, 404 and 406 respectively of FIG. 14. Aperture 512 corresponds to 405 of FIG. 14 and electrodes 516 (joined by conductive tracks 514) and 510 (joined by conductive tracks 508) correspond to electrodes 408 and 410 of FIG. 14. The switch array 500 can act as a sensor to sense the location of a force applied from one layer to another. For example a force applied to layer 506 toward layer 502 will cause one or more electrodes at the location of the applied force to make electrical contact. The force may be cause by relative movement between the layers 502 and 506, for example bending of the composite flexible switch array assembly 500.

Figure 16:
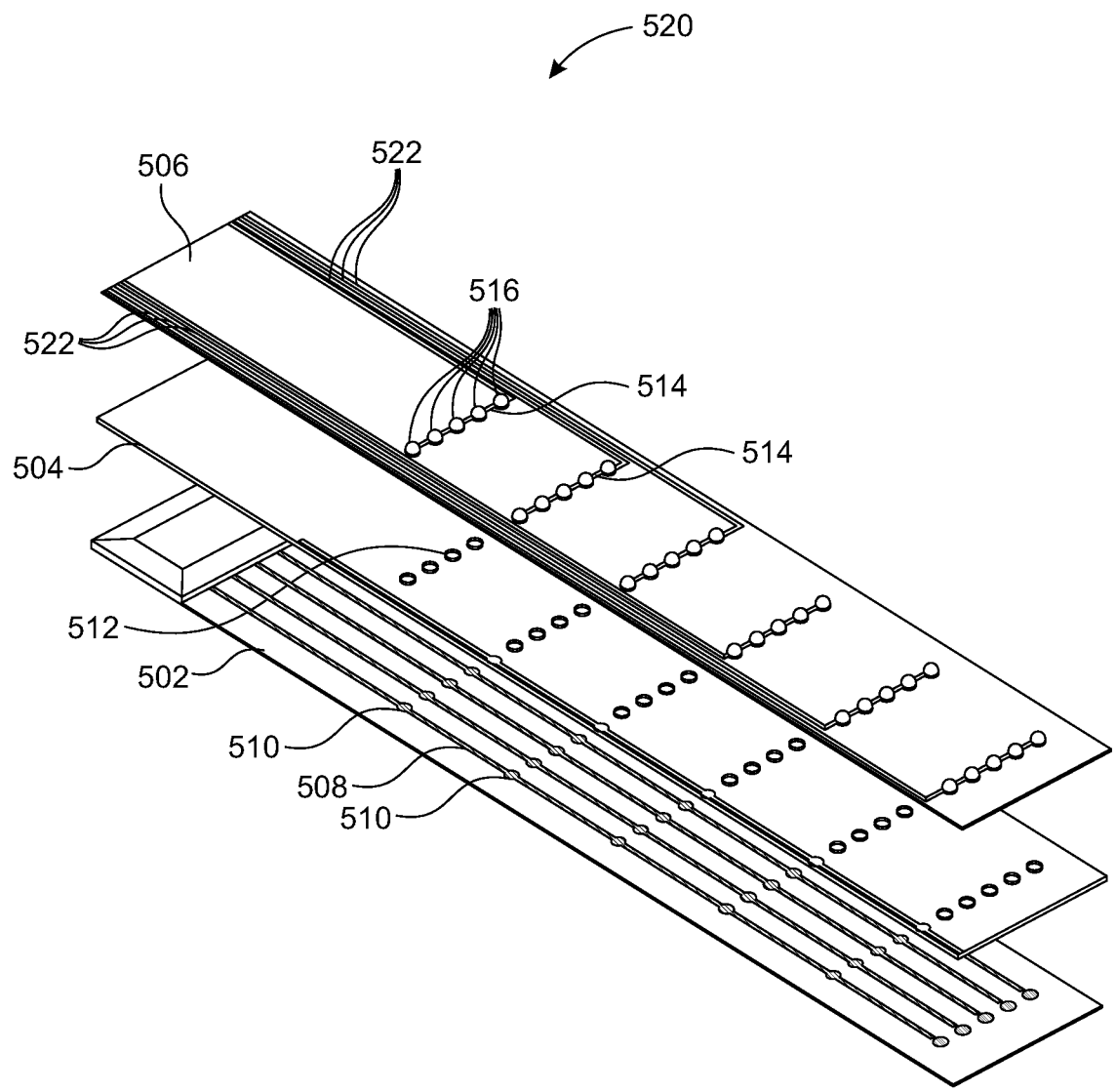
FIG. 16 shows another example of a switch array similar to that of FIG. 15.

Another example is shown in FIG. 16 in which a sensor 520 is provided. The same features shown in FIG. 15 have the same reference numerals. Additional conductor tracks 522 show how the electrodes are provided to electronic circuitry to enable the open or closed states of the switches that constitute the switch array to be provided in a form suitable for interpretation by a microprocessor or similar processing device.

Figure 17:
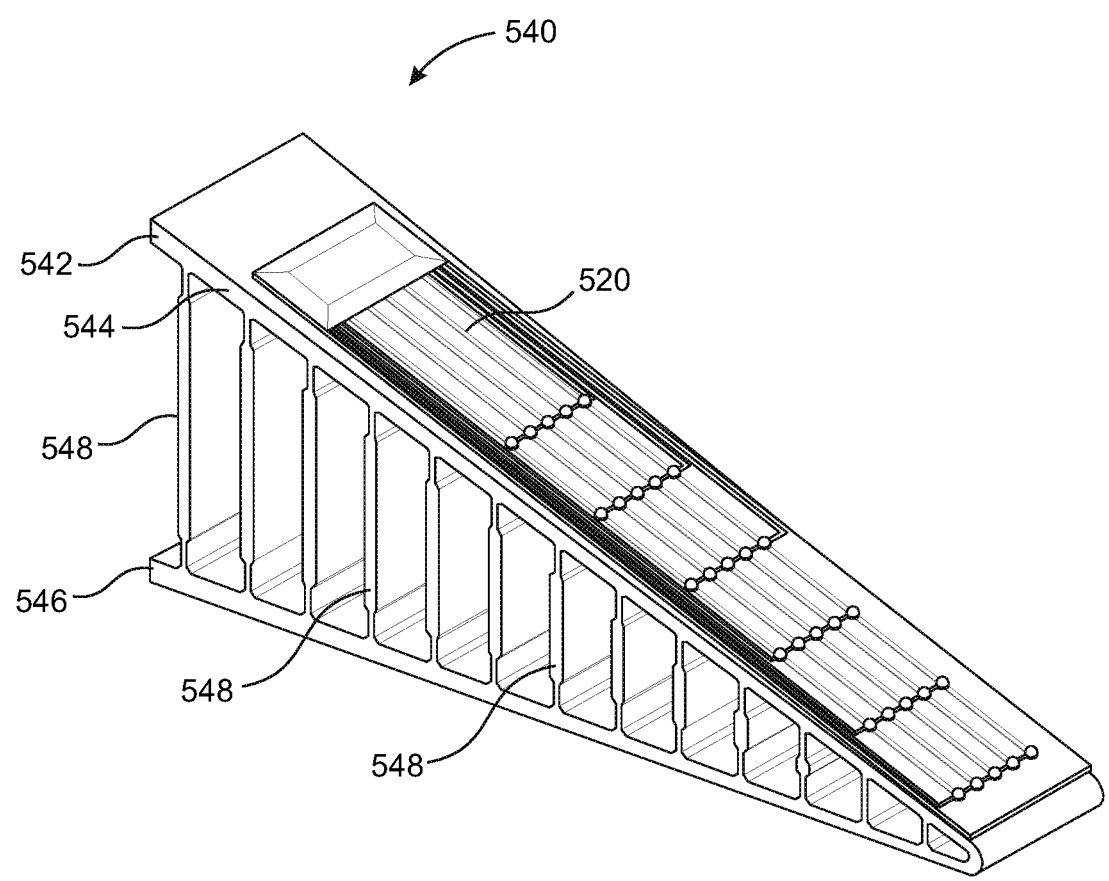
FIG. 17 shows a gripping apparatus including a sensor according to FIG. 16.

In FIG. 17 the sensor 520 is incorporated into or onto a flexible gripping apparatus 540 which comprises flexible longitudinal structures 542 and 546 spanned by transverse structures 548. Operation of the gripper apparatus is shown in FIG. 18A-D in which it can be seen that the apparatus may be operated in pairs in this example to grasp an object 542. The degree of flexure of each apparatus 540 is detected using sensors 520. Thus the apparatus can be controlled using feedback from sensors 520.

From the foregoing it will be seen that a switch is provided which enables an improved switching including the potential to provide a larger difference between an on and off state, or between states.

Unless the context clearly requires otherwise, throughout the description, the words "comprise", "comprising", and the like, are to be construed in an inclusive sense as opposed to an exclusive or exhaustive sense, that is to say, in the sense of "including, but not limited to".

Although this invention has been described byway of example and with reference to possible embodiments thereof, it is to be understood that modifications or improvements may be made thereto without departing from the scope of the invention. The invention may also be said broadly to consist in the parts, elements and features referred to or indicated in the specification of the application, individually or collectively, in any or all combinations of two or more of said parts, elements or features. Furthermore, where reference has been made to specific components or integers of the invention having known equivalents, then such equivalents are herein incorporated as if individually set forth.

Any discussion of the prior art throughout the specification should in no way be considered as an admission that such prior art is widely known or forms part of common general knowledge in the field.

What is claim is:

1. A switch comprising:
   a reversibly deformable body; and
   a plurality of elements supporting a plurality of electrodes; each element comprising a conductive portion, the plurality of elements extending from the reversibly deformable body, the elements having a greater cross section distal from the reversibly deformable body or configured to increase in cross section distal from the reversibly deformable body;
   wherein:
   the reversibly deformable body is electrically connected to a plurality of the plurality of elements, and the reversibly deformable body comprises a plurality of conductive pathways configured to conduct electric signals to or from the electrodes; and
   when a force is applied to the reversibly deformable body the plurality of elements are configured to move between a first state wherein the conductive portions of the plurality of elements are in physical and electrical contact and a second state wherein the conductive portions of the plurality of elements are spaced apart.

2. A switch comprising:
   a reversibly deformable body;
   a plurality of electrodes being provided on and extending from the reversibly deformable body; the switch comprising a first state in which the plurality of electrodes are spaced apart and a second state in which the plurality of electrodes are in physical and electrical contact;
   a plurality of electrode support elements extend from the reversibly deformable body to support the plurality of electrodes;
   wherein:
   the reversibly deformable body is electrically connected to the plurality of electrodes and comprises a plurality of conductive pathways configured to conduct electric signals to or from the electrodes; and
   the switch is configured to allow movement between states when a force is applied to or removed from the reversibly deformable body, or an existing pre-straining force is released.

3. The switch of claim 2, wherein the plurality of electrodes are provided spaced from the reversibly deformable body.

4. The switch of claim 2, wherein a profile of one or more of the plurality of electrode support elements is any one or more of:
   T-shaped; or
   inverted triangular shaped; or
   tapered.

5. The switch of claim 2, wherein level or type of deformation or strain necessary for movement between the first state and the second state is adjustable by varying one or more of:
   a flexibility of the reversibly deformable body; or
   the existing pre-straining force; or
   a distance between the plurality of electrodes; or
   a resistance of the electrodes; or
   a height or length of the electrode support elements; or
   an arrangement of the electrode support elements on the reversibly deformable body.

6. The switch of claim 2, wherein the switch is configured to move between the first and second states at or beyond a known, or substantially known force.

7. The switch of claim 6, comprising one or more further states, wherein the first, second and the one or more further states provide discrete switching levels.

8. A sensor comprising the switch of claim 2.

9. The sensor of claim 8, wherein the sensor is configured to:
   be incorporated into an apparatus and detect a degree of flexure of the apparatus to enable control of the apparatus; or sense a location and an amount of the force applied; or monitor critical force, pressure, or other physical phenomena causing deformation.

10. The switch of claim 2, wherein at least one of the plurality of electrode support elements comprise a first end coupled to the reversibly deformable body and a distal end remote from the reversibly deformable body, the distal end comprising a respective electrode.

11. The switch of claim 10, wherein the distal ends of the plurality of electrode support elements are in contact in the second state.

12. The switch of claim 10, wherein distal end is wider than first end.

13. The switch of claim 2, wherein at least one of the plurality of electrodes are provided on a compliant element.

14. The switch of claim 13, the plurality of electrodes being provided on an array of compliant elements, wherein:

the array of compliant elements are elongate and arranged in parallel; or the array of compliant elements are arranged in a first array of elements and a second array of elements, the elements of each array being interdigitated.

* * * * *